(12) United States Patent
Oh

(10) Patent No.: US 7,042,786 B2
(45) Date of Patent: May 9, 2006

(54) MEMORY WITH ADJUSTABLE ACCESS TIME

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 213 days.

(21) Appl. No.: 10/832,117

(22) Filed: Apr. 26, 2004

(65) Prior Publication Data

US 2005/0237837 A1    Oct. 27, 2005

(51) Int. Cl.
  G11C 11/4063    (2006.01)
  G11C 11/4076    (2006.01)
  G11C 11/408     (2006.01)
  G11C 11/4091    (2006.01)

(52) U.S. Cl. ............. 365/222; 365/194; 365/196; 365/233; 711/106

(58) Field of Classification Search ........... 365/194, 365/222, 233, 195, 196; 711/106
See application file for complete search history.

(56) References Cited

U.S. PATENT DOCUMENTS

| | | | |
|---|---|---|---|
| 4,809,233 A | 2/1989 | Takemae | 365/222 |
| 5,206,830 A | 4/1993 | Isobe et al. | 365/194 |
| 5,596,545 A * | 1/1997 | Lin | 365/236 |
| 5,617,551 A | 4/1997 | Corder | 395/401 |
| 6,298,000 B1 | 10/2001 | Kitade et al. | 365/222 |
| 6,473,353 B1 | 10/2002 | Jo et al. | 365/222 |
| 6,501,699 B1 | 12/2002 | Mizugaki | 365/222 |
| 6,597,615 B1 | 7/2003 | Mizugaki | 365/222 |
| 6,636,449 B1 * | 10/2003 | Matsuzaki | 365/222 |
| 6,654,303 B1 | 11/2003 | Miyamoto et al. | 365/222 |
| 6,700,828 B1 | 3/2004 | Mizugaki | 365/222 |
| 6,707,745 B1 | 3/2004 | Mizugaki | 365/222 |
| 6,850,449 B1 * | 2/2005 | Takahashi | 365/222 |
| 6,862,237 B1 * | 3/2005 | Kato | 365/222 |
| 6,876,592 B1 * | 4/2005 | Takahashi et al. | 365/222 |
| 2002/0039316 A1 * | 4/2002 | Tobita | 365/222 |
| 2003/0231521 A1 * | 12/2003 | Ohsawa | 365/174 |
| 2005/0229077 A1 * | 10/2005 | Takahashi | 714/758 |
| 2005/0289293 A1 * | 12/2005 | Parris et al. | 711/106 |

* cited by examiner

Primary Examiner—Richard Elms
Assistant Examiner—J. H. Hur
(74) Attorney, Agent, or Firm—Dicke, Billig and Czaja, PLLC

(57) ABSTRACT

A memory comprising a memory array, an address buffer configured to receive an external address, a refresh address counter configured to generate a refresh address, a first circuit configured to detect a distance between the external address and refresh address, and a second circuit configured to generate at least one timing signal for accessing data associated with the external address from the memory array in response to the distance is provided.

22 Claims, 7 Drawing Sheets

| REGION | DISTANCE FROM LAST REFRESH ADDRESS TO $X_k$ | STORAGE DATA LOSS RISK | WRITE LINE START TO BIT LINE START | BIT LINE START TO WRITE LINE END | TIME |
|---|---|---|---|---|---|
| REGION 1 | (0 to 0.375) * tREF | NEGLIGIBLE | SHORT | EXTENDED | ~ tNOM |
| REGION 2 | (0.375 to 0.75) * tREF | MODERATE | MEDIUM | MEDIUM | ~ tNOM |
| REGION 3 | (0.75 to 1.0) * tREF | LIKELY | EXTENDED | SHORT | ~ tNOM |
| $X_a = X_k$ | 0 | LIKELY | 2 CYCLES ARE MERGED INTO 1 $X_k$ ACCESS | | ~ tEXT / 2 |

| REFRESH $X_a$ | EXTENDED | EXTENDED | ~ tEXT |
|---|---|---|---|

Fig. 4

MEMORY WITH ADJUSTABLE ACCESS TIME

BACKGROUND

Mobile telephones and other electronic devices often include a main memory that is used to provide relatively fast access to information such as instructions and data. One form of such a memory is a pseudo-static random access memory (PSRAM). PSRAM includes memory cells that are arranged in an array of rows and columns. Each memory cell can store a single bit of information. PSRAM is a volatile memory which means that the memory cells only store the information as long as power is provided and as long as the memory cells are refreshed on a periodic basis. If the power is turned off or the memory cells are not refreshed, information stored in a PSRAM is lost.

During normal operation, a refresh operation is performed periodically to refresh the memory cells in a PSRAM. The refresh operation may be performed transparently to the memory access by assigning a refresh window inside a normal access to the PSRAM. Unfortunately, the refresh window typically increases the amount of time its takes a host to perform a normal access to the PSRAM. The delay associated with refresh operations may cause the performance of the mobile telephone or other electronic device to suffer. It would be desirable to reduce the amount of time associated with a memory access for a PSRAM.

SUMMARY

According to one exemplary embodiment, a memory comprising a memory array, an address buffer configured to receive an external address, a refresh address counter configured to generate a refresh address, a first circuit configured to detect a distance between the external address and refresh address, and a second circuit configured to generate at least one timing signal for accessing data associated with the external address from the memory array in response to the distance is provided.

BRIEF DESCRIPTION OF THE DRAWINGS

FIG. 4 is a table illustrating an embodiment of adjusting access times in a PSRAM.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment, a pseudo-static random access memory (PSRAM) with an adjustable access time is provided. An external address provided to the PSRAM to access a row in a memory array is compared to an internal refresh address to determine how recently the row was refreshed. Using the result of this comparison, the overall access time may be reduced.

Figure 1:
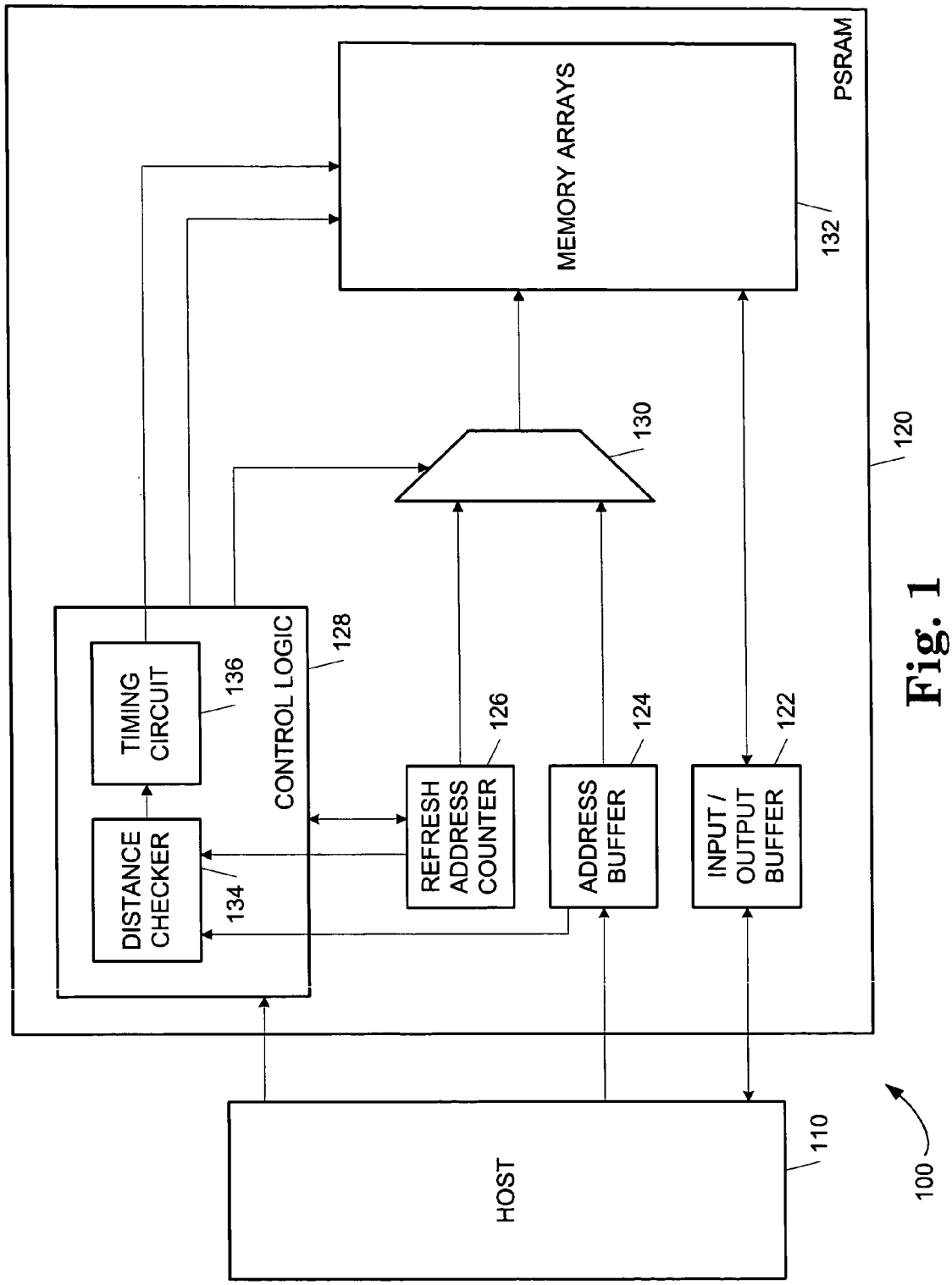
FIG. 1 is a block diagram illustrating an embodiment of a system that comprises a host and a PSRAM.

FIG. 1 is a block diagram illustrating an embodiment of a system 100 that comprises a host 110 coupled to a PSRAM 120. PSRAM 120 comprises an input/output (I/O) buffer 122, an address buffer 124, a refresh address counter 126, control logic 128, a multiplexer 130, and a plurality of memory arrays 132. Control logic 128 comprises a distance checker block 134 and a timing circuit 136.

Host 110 may be a mobile telephone or any other electronic device. Host 110 communicates with PSRAM 120 by providing and receiving data from I/O buffer 122, providing addresses to address buffer 124, and providing control signals to control logic 128 to cause data to be stored in and retrieved from memory arrays 132. PSRAM 120 receives the data, addresses, and control signals using I/O buffer 122, address buffer 124, and control logic 128, respectively, and stored information in or retrieves information from memory arrays 132 in response to the data, addresses, and control signals.

Figure 2:
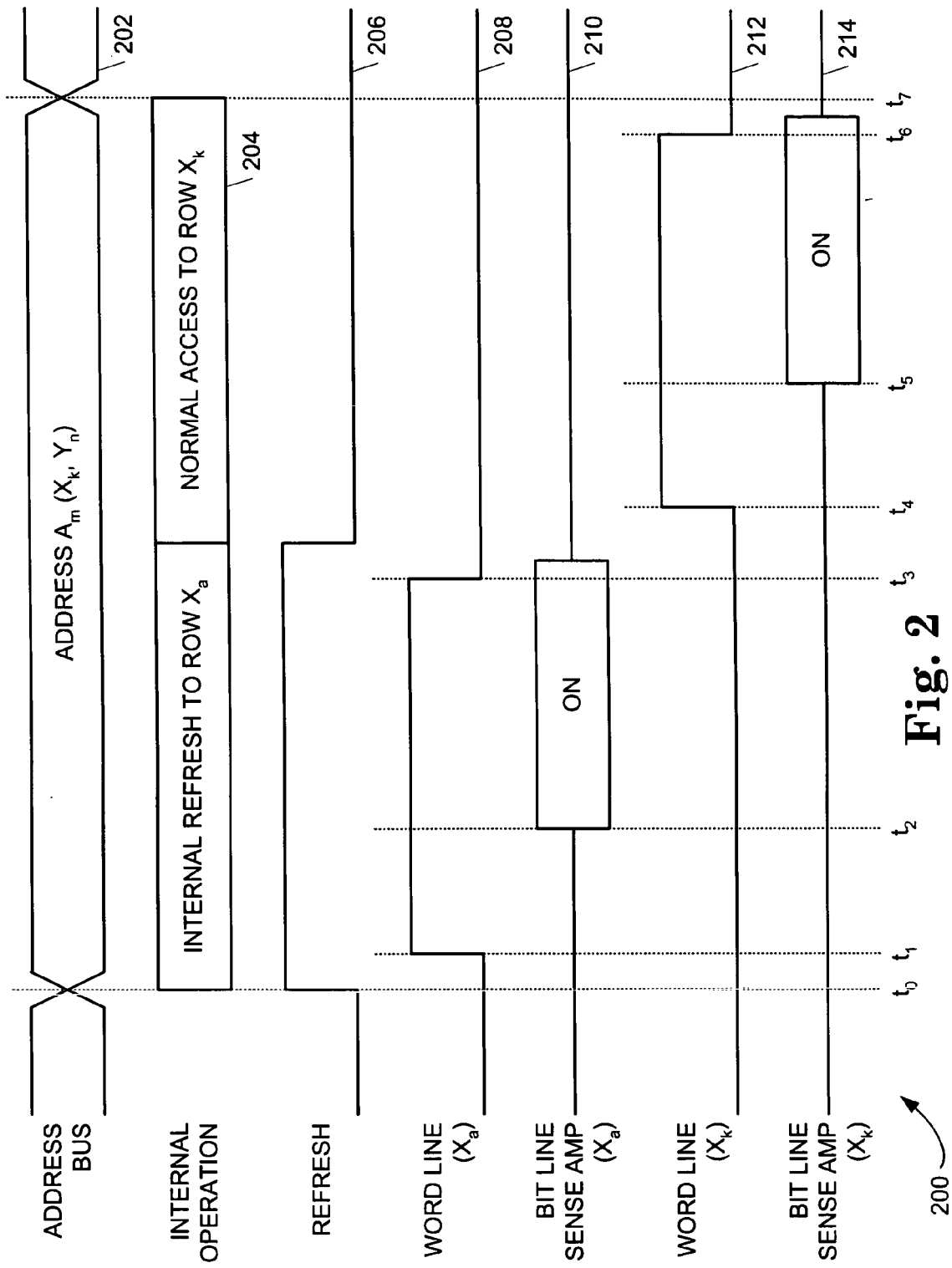
FIG. 2 is a timing diagram illustrating an embodiment of an access to a PSRAM.

During normal operation, refresh operations are performed transparently to the memory access by assigning a refresh window inside a normal access to PSRAM 120. The refresh operations refresh the memory cells in PSRAM 120. In response to receiving a memory access from host 110, control logic 128 provides control signals to refresh address counter 126, multiplexer 130, and memory arrays 132 to cause memory cells in memory arrays 132 to be refreshed. FIG. 2 illustrates the timing of refreshing memory cells in memory arrays 132 within an access.

FIG. 2 is a timing diagram 200 illustrating an embodiment of an access to PSRAM 120 by host 110. In response to an address $A_m$ (which comprises a word line address portion $X_k$ and a bit line address portion $Y_n$) being driven on the address bus by host 110 beginning at a time $t_0$ as shown on an address bus line 202 along with a command (not shown), PSRAM 120 initiates an internal refresh operation to a row in memory arrays 132 using a refresh address $X_a$ as shown on an internal operation line 204. In response to the internal refresh operation, a refresh signal is driven high as shown on refresh signal line 206.

In response to the refresh signal being driven high, control logic 128 causes multiplexer 130 to provide the refresh address ($X_a$) from refresh address counter 126 to memory arrays 132. The word line to memory arrays 132 is driven with the refresh address $X_a$ starting at a time $t_1$ as shown on a word line signal line 208. At a time $t_2$, a sense amplifier for each bit line associated with the refresh address $X_a$ is activated or turned on as shown on a bit line signal line 210. The refresh address $X_a$ is driven on the word line to memory arrays 132 until a time $t_3$ as shown on the word line signal line 208.

Subsequent to the refresh operation, PSRAM 120 initiates a normal access to a row in memory arrays 132 using the external address $X_k$ as shown on the internal operation line 204. In response to the normal access, the refresh signal is driven low as shown on refresh signal line 206.

In response to the refresh signal being driven low, control logic 128 causes multiplexer 130 to provide the external address ($X_k$) from address buffer 124 to memory arrays 132. The word line to memory arrays 132 is driven with the external address $X_k$ starting at a time $t_4$ as shown on a word line signal line 212. At a time $t_5$, a sense amplifier for each bit line associated with the external address $X_k$ is activated or turned on as shown on a bit line signal line 214. The external address $X_k$ is driven on the word line to memory arrays 132 until a time $t_6$ as shown on the word line signal line 212 to cause data to be read from or written to memory arrays 132. The access completes at a time $t_7$.

In FIG. 2, the period between $t_1$ and $t_2$ and the period between $t_4$ and $t_5$ represent the amount time between driving a word line address ($X_a$ or $X_k$) to memory arrays 132 and activating the bit line sense amplifiers to ensure the full transfer of the memory cell signal to the bit line sense amplifiers. The period between $t_2$ and $t_3$ and the period between $t_5$ and $t_6$ represent the amount time between activating the bit line sense amplifiers and stopping the word line address ($X_a$ or $X_k$) from being driven to memory arrays 132 to ensure the full restore/write-back operation to the memory cell.

By comparing the external address $X_k$ provided to PSRAM 120 to the refresh address $X_a$, a determination may be made as to how recently the row associated with the external address $X_k$ was refreshed by determining a distance between the external address $X_k$ and the internal refresh address $X_a$. Using this distance, the time window associated with the access may be reduced by reducing the amount of time for the normal access to the row associated with the external address $X_k$. In particular, the amount of time between driving the word line address $X_k$ to memory arrays 132 and activating the bit line sense amplifiers (i.e., the period between $t_4$ and $t_5$) may be reduced. In addition, the amount of time between activating the bit line sense amplifiers and stopping the word line address $X_k$ from being driven to memory arrays 132 (i.e., the period between $t_5$ and $t_6$) may be reduced.

Figure 3:
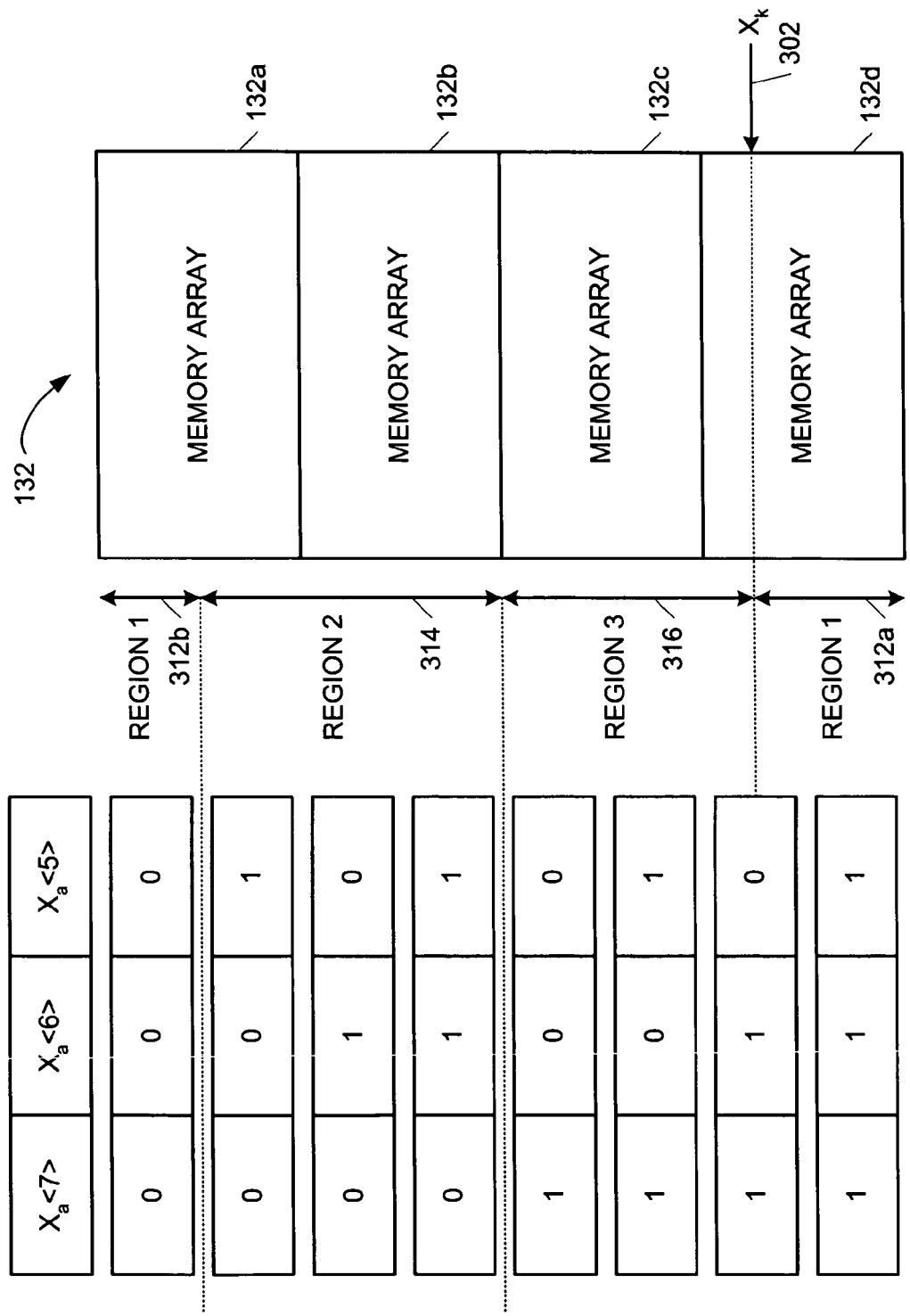
FIG. 3 is a diagram illustrating an embodiment of regions of a memory array.

To determine how recently a row associated with an external address $X_k$ was refreshed, the refresh address $X_a$ is used to segment memory arrays 132 into regions. FIG. 3 is a diagram illustrating an embodiment of regions of memory array 132. In FIG. 3, memory arrays 132 comprise memory array 132a, 132b, 132c, and 132d and an example external address $X_k$ 302 is associated with a row in memory array 132d.

Using the three most significant bits of the refresh address $X_a$, i.e., $X_a<7>$, $X_a<6>$, and $X_a<5>$, memory arrays 132 are segments into three regions based on the relative location of the row associated with external address $X_k$ 302. In the example of FIG. 3, region 1 comprises the portions of memory arrays 132 addressable from just past the external address $X_k$ 302, i.e., ($X_k$+1), to the highest numbered address where the three most significant bits of the refresh address $X_a$ are "000", i.e., $X_a$=00011111, as indicated by the arrows 312a and 312b. Region 2 comprises the portions of memory arrays 132 addressable from the lowest numbered address where the three most significant bits of the refresh address $X_a$ are "001", i.e., $X_a$=00100000, to the highest numbered address where the three most significant bits of the refresh address $X_a$ are "011", i.e., $X_a$=01111111, as indicated by the arrow 314. Region 3 comprises the portions of memory arrays 132 addressable from the lowest numbered address where the three most significant bits of the refresh address $X_a$ are "100", i.e., $X_a$=10000000, to the just prior to the external address $X_k$ 302, i.e., ($X_k$−1).

Memory arrays 132 are refreshed using an incremental wraparound refresh counter, i.e., refresh counter 126 provides sequential addresses to memory arrays 132 from $X_a$=00000000 to $X_a$=11111111. Accordingly, the distance checker block 134 determine which region the refresh address $X_a$ is in to determine the distance between the external address $X_k$ and the refresh address $X_a$. The distance provides a relative time range which indicates how recently a row associated with external address $X_k$ 302 was refreshed.

FIG. 4 is a table 400 illustrating an embodiment of adjusting access times in PSRAM 120 according to the region that the refresh address $X_a$ falls into with respect to the external address $X_k$. Depending on the region into which the refresh address $X_a$ falls, the amount of time between driving the word line address $X_k$ to memory arrays 132 and activating the bit line sense amplifiers (i.e., the period between $t_4$ and $t_5$) and the amount of time between activating the bit line sense amplifiers and stopping the word line address $X_k$ from being driven to memory arrays 132 (i.e., the period between $t_5$ and $t_6$) are adjusted.

Table portion 402 lists relative times for the internal refresh operation to refresh address $X_a$. In particular, for a refresh operation to refresh address $X_a$, the amount of time between driving the word line address $X_a$ to memory arrays 132 and activating the bit line sense amplifiers (i.e., the period between $t_1$ and $t_2$) is a relatively extended time period as shown in FIG. 2. Similarly, the amount of time between activating the bit line sense amplifiers and stopping the word line address $X_a$ from being driven to memory arrays 132 (i.e., the period between $t_2$ and $t_3$) comprises a relatively extended time period as shown in FIG. 2. The access time for the refresh operation approximates an extended access time (tEXT).

Table portion 404 lists relative times for the normal access to address $X_k$. If the refresh address $X_a$ is in region 1, then the distance between the refresh address $X_a$ and the external address $X_k$ is between zero and 0.375 of the total time to refresh memory arrays 132 (tREF), i.e., between zero and 0.375 time the total time to refresh memory arrays 132 has elapsed since the memory cells associated with the refresh address $X_k$ were refreshed. Because the memory cells were refreshed relatively recently, the risk of storage data loss is negligible. In addition, the stored data in the memory cells is relatively full and less time is needed to ensure transfer of the full signal from the memory cells to the bit line sense amplifiers. Accordingly, the amount of time between driving the word line address $X_k$ to memory arrays 132 and activating the bit line sense amplifiers (i.e., the period between $t_4$ and $t_5$) comprises a relatively short time period.

Because the memory cells were refreshed relatively recently when the refresh address $X_a$ is in region 1, the memory cells will not be refreshed again for a relatively long period of time. As a result, the amount of time between activating the bit line sense amplifiers and stopping the word line address $X_k$ from being driven to memory arrays 132 (i.e., the period between $t_5$ and $t_6$) comprises a relatively extended time period to allow the write-back to the memory cells to be strengthened. The total access time if the refresh address $X_a$ is in region 1 approximates a nominal access time (tNOM).

If the refresh address $X_a$ is in region 2, then the distance between the refresh address $X_a$ and the external address $X_k$ is between 0.375 and 0.75 of the total time to refresh memory arrays 132 (tREF), i.e., between 0.375 and 0.75 time the total time to refresh memory arrays 132 has elapsed since the memory cells associated with the external address $X_k$ were refreshed. Because the memory cells were refreshed somewhat recently, the risk of storage data loss is moderate. To ensure functionality, the amount of time between driving the word line address $X_k$ to memory arrays 132 and activating the bit line sense amplifiers (i.e., the period between $t_4$ and $t_5$) comprises a relatively medium time period. Similarly, the amount of time between activating the bit line sense amplifiers and stopping the word line address $X_k$ from being driven to memory arrays 132 (i.e., the period between $t_5$ and $t_6$), however, comprises a relatively medium time period. The total access time if the refresh address $X_a$ is in region 2 approximates a nominal access time (tNOM).

If the refresh address $X_a$ is in region 3, then the distance between the refresh address $X_a$ and the external address $X_k$ is between 0.75 and 1.0 of the total time to refresh memory arrays 132 (tREF), i.e., between 0.75 and 1.0 time the total time to refresh memory arrays 132 has elapsed since the memory cells associated with the external address $X_k$ were refreshed. Because the memory cells were not refreshed recently, the risk of storage data loss is likely. In addition, the stored data in the memory cells is less than full and additional time is needed to ensure transfer of the full signal from the memory cells to the bit line sense amplifiers. Accordingly, the amount of time between driving the word line address $X_k$ to memory arrays 132 and activating the bit line sense amplifiers (i.e., the period between $t_4$ and $t_5$) comprises a relatively extended time period.

Because the memory cells were not refreshed relatively recently when the refresh address $X_a$ is in region 3, the memory cells will be refreshed relatively soon. As a result, the amount of time between activating the bit line sense amplifiers and stopping the word line address $X_k$ from being driven to memory arrays 132 (i.e., the period between $t_5$ and $t_6$) comprises a relatively short time period. The total access time if the refresh address $X_a$ is in region 3 approximates a nominal access time (tNOM).

If the refresh address $X_a$ is equal to the external address $X_k$, then the distance between the refresh address $X_a$ and the external address $X_k$ is zero. The refresh operation and the normal access to address $X_k$ are merged into a single operation, i.e., the normal access and the refresh operation are done simultaneously. Because the memory cells were not refreshed recently, the risk of storage data loss is likely. In addition, the stored data in the memory cells is less than full and additional time is needed to ensure transfer of the full signal from the memory cells to the bit line sense amplifiers. Accordingly, the amount of time between driving the word line address $X_k$ to memory arrays 132 and activating the bit line sense amplifiers (i.e., the period between $t_4$ and $t_5$) comprises a relatively extended time period. With the refresh address $X_a$ equal to the external address $X_k$, the memory cells will not be refreshed again for a relatively long period of time. As a result, the amount of time between activating the bit line sense amplifiers and stopping the word line address $X_k$ from being driven to memory arrays 132 (i.e., the period between $t_5$ and $t_6$) comprises a relatively extended time period to allow the write-back to the memory cells to be strengthened. The total access time if the refresh address $X_a$ is equal to the external address $X_k$ approximates one half of the extended access time (tEXT/2).

In each of the cases above, the amount of time to perform the overall access to address $X_k$ is reduced by reducing the amount of time to perform the normal access to address $X_k$. In particular, the amount of time to perform the normal access may be the nominal access time (which is less than the extended access time) or be merged with the refresh operation. Accordingly, the overall access time becomes approximately the total of the extended access time and the nominal access time (i.e., tEXT+tNOM) when the refresh address $X_a$ is in region 1, 2, or 3, and the overall access time becomes approximately one-half of the extended access time (i.e., tEXT/2) when the refresh address $X_a$ is equal to the external address $X_k$.

Figure 5:
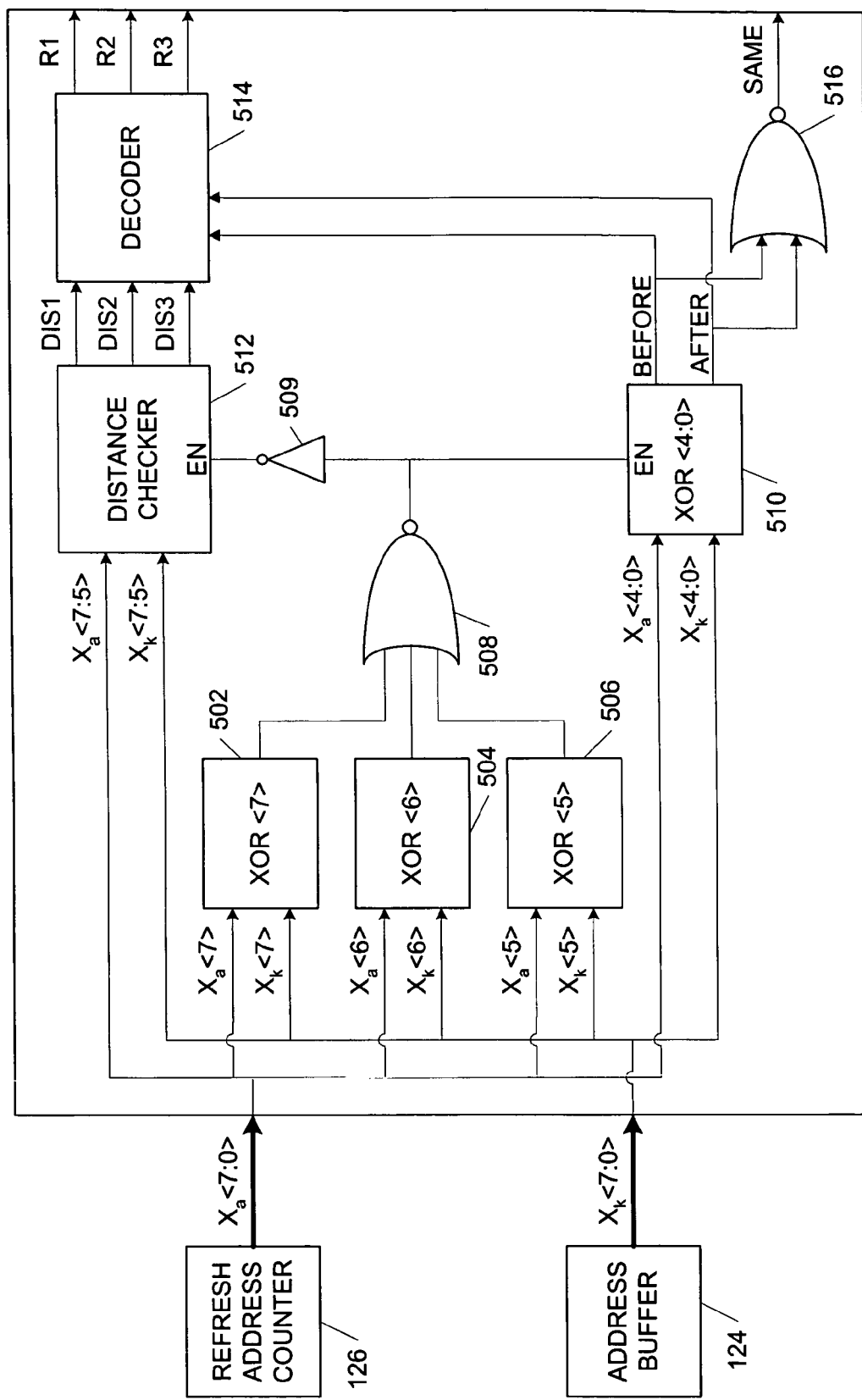
FIG. 5 is a block diagram illustrating an embodiment of selected portions of the PSRAM shown in FIG. 1.

Referring back to FIG. 1, distance checker block 134 is configured to determine which region the refresh address $X_a$ is in relative to the external address $X_k$. FIG. 5 is a block diagram illustrating an embodiment of selected portions of PSRAM 120 shown in FIG. 1. In FIG. 5, distance checker block 134 comprises XOR gates 502, 504, 506, and 508, an inverter 509, an XOR block 510, a distance checker circuit 512, a decoder circuit 514, and an XOR gate 516.

In the embodiment shown in FIG. 5, the external address $X_k$ and the refresh address $X_a$ each comprise 8 bits, i.e. bits <7:0>. Address buffer 124 provides the external address <7:0> to distance checker block 134, and refresh address counter 126 provides the refresh address <7:0> to distance checker block 134. In distance checker block 134, bit comparisons are performed on bits 7, 6, and 5 of the external address and the refresh address using XOR gates 502, 504, and 506, respectively. The outputs of XOR gates 502, 504, and 506 are input to XOR gate 508 to generate an output which is provided to the input of inverter 509 and an enable input (EN) of XOR block 510. The output of inverter 509 is provided to an enable input (EN) of distance checker circuit 512.

XOR block 510 receives the external address bits <4:0> and the refresh address bits <4:0> along with the output from XOR gate 508 and generates a BEFORE output and an AFTER output. The BEFORE and AFTER outputs are used to determine whether the refresh address $X_a$ is prior to, the same as, or subsequent to the external address $X_k$ when the three most significant bits of the refresh address $X_a$ and the external address $X_k$ are equal. The BEFORE and AFTER outputs are input to decoder 514 and XOR gate 516. XOR gate 516 receives the BEFORE and AFTER outputs and generates a SAME output to indicate whether the refresh address $X_a$ is equal to the external address $X_k$.

Distance checker circuit 512 receives the external address bits <7:5> and the refresh address bits <7:5> along with the output from inverter 509 and generates DIS1, DIS2, and DIS3 outputs. The DIS1, DIS2, and DIS3 outputs are input to decoder 514. Decoder 514 receives the DIS1, DIS2, DIS3, BEFORE, and AFTER outputs and generates R1, R2, and R3 outputs to indicate whether the refresh address $X_a$ is in region 1, region 2, or region 3.

Figure 6:
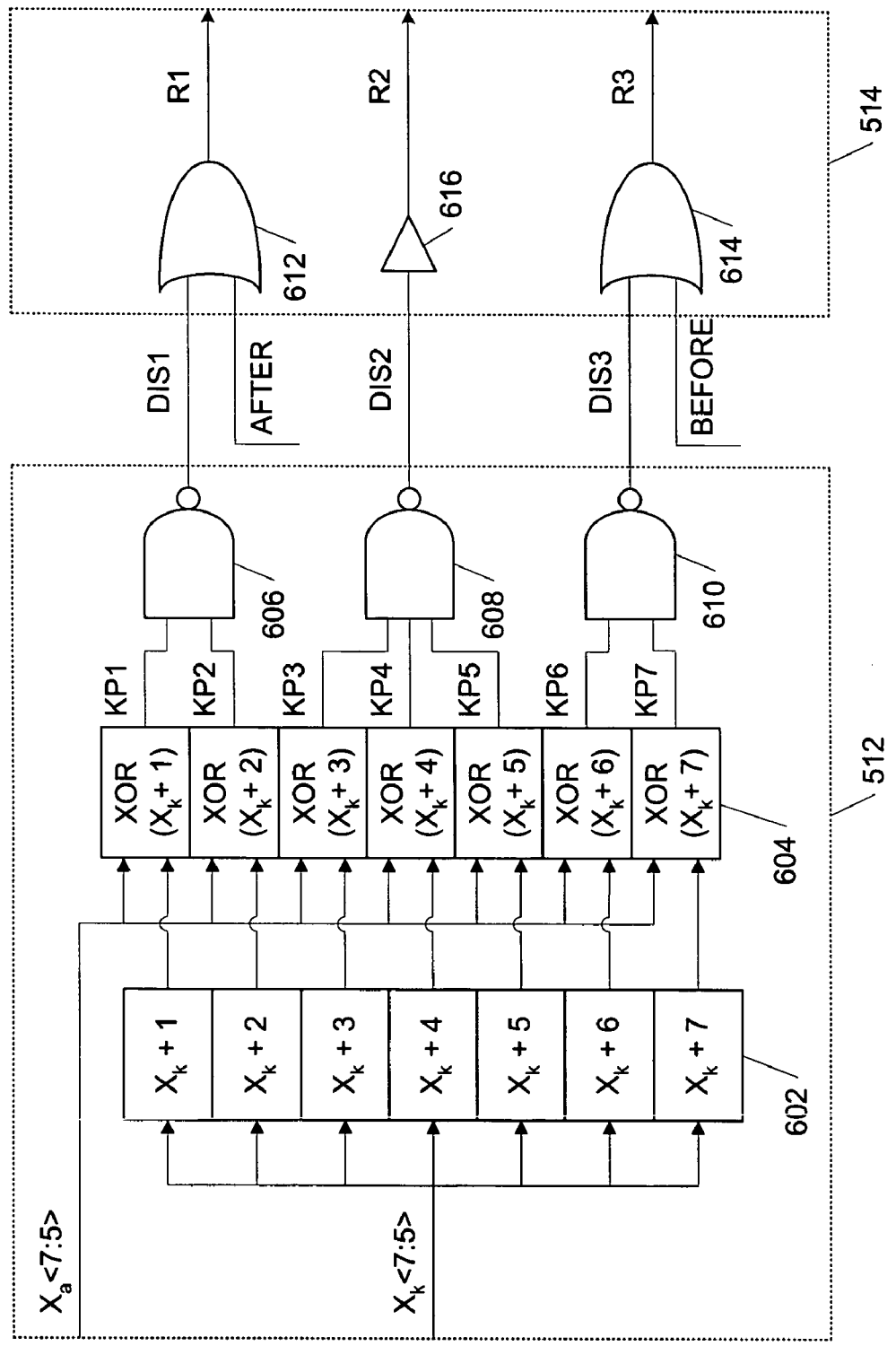
FIG. 6 is a block diagram illustrating an embodiment of selected portions of a distance checker block.

FIG. 6 is a block diagram illustrating an embodiment of selected portions of distance checker block 134. Distance checker circuit 512 comprises a 3-bit counter circuit 602, a comparison circuit 604, and NAND gates 606, 608, and 610. Decoder circuit 514 comprises AND gates 612 and 614 and buffer 616.

External address bits <7:5> are input to 3-bit counter circuit 602 to generate seven outputs ($X_k$+1) though ($X_k$+7). The seven outputs are input to comparison circuit 604 along with refresh address bits <7:5>. In comparison circuit 604, the seven outputs from 3-bit counter circuit 602 are compared refresh address bits <7:5> using XOR gates to generate seven outputs, KP1 to KP7. Outputs KP1 and KP2 are input to NAND gate 606 to generate the output DIS1. Outputs KP3, KP4, and KP5 are input to NAND gate 608 to generate the output DIS2. Outputs KP6 and KP7 are input to NAND gate 610 to generate the output DIS3.

Output DIS1 and the AFTER signal from XOR block 510 are input to AND gate 614 to generate signal R1 to indicate that the refresh address $X_a$ is in region 1. Output DIS2 are input to buffer 616 to generate signal R2 to indicate that the refresh address $X_a$ is in region 2. Output DIS3 and the BEFORE signal from XOR block 510 are input to AND gate 614 to generate signal R3 to indicate that the refresh address $X_a$ is in region 3. Distance checker block 134 provides the R1, R2, R3 signals to timing circuit 136.

Figure 7:
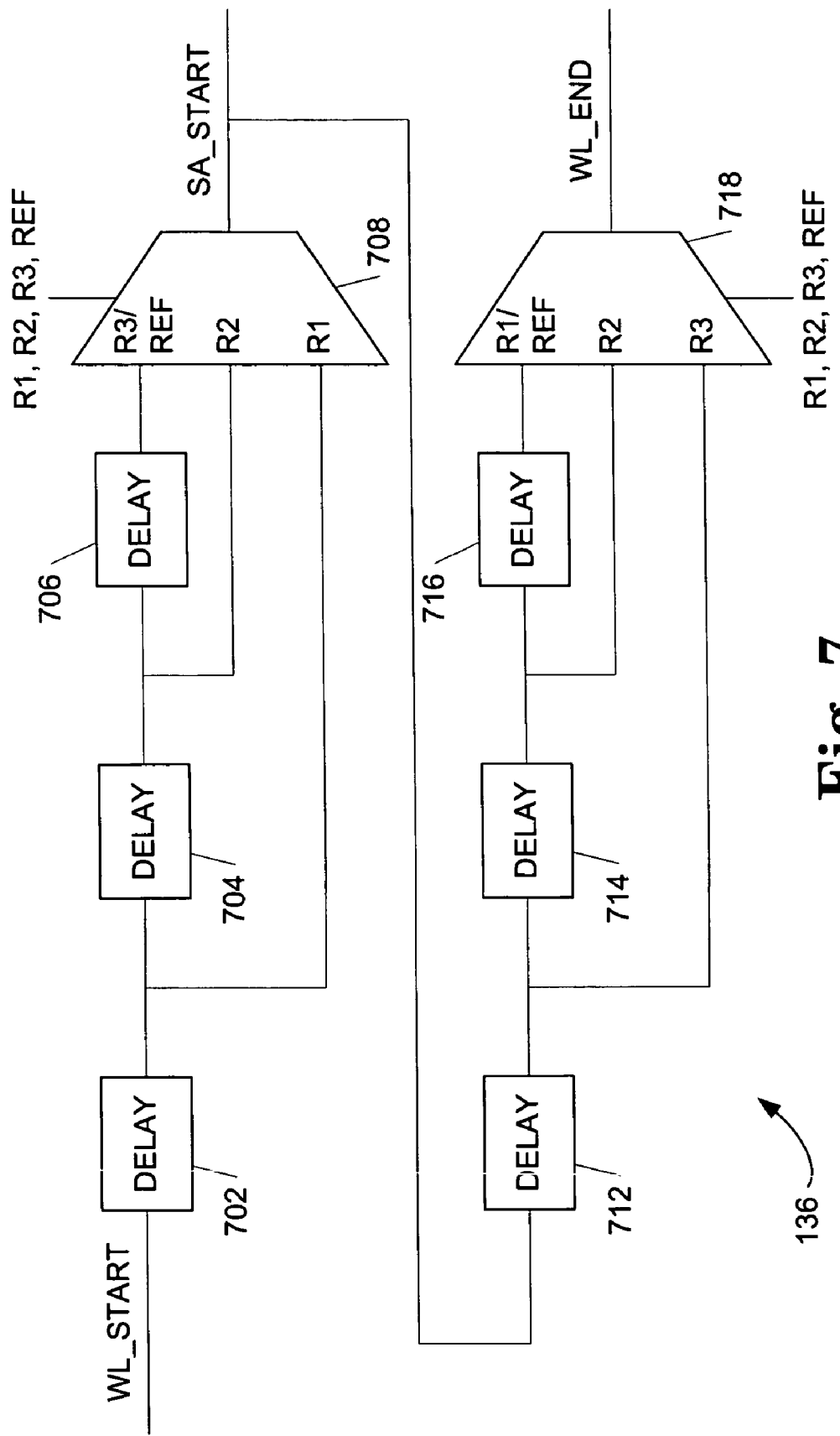
FIG. 7 is a block diagram illustrating an embodiment of a timing circuit.

FIG. 7 is a block diagram illustrating an embodiment of timing circuit 136. In this embodiment, timing circuit 136 generates a sense amplifier start signal (SA_START) using a word line start signal (WL_START). Timing circuit 136 also generates a word line end signal (WL_END) using the sense amplifier start signal (SA_START).

Timing circuit 136 receives the R1, R2, R3 signals from distance checker block 134 and a refresh signal (REF) from control circuit 128. Timing circuit 136 uses the R1, R2, R3, and refresh signals to adjust the amount of time between driving the word line address $X_k$ to memory arrays 132 and activating the bit line sense amplifiers (i.e., the period between $t_4$ and $t_5$) and the amount of time between activating the bit line sense amplifiers and stopping the word line address $X_k$ from being driven to memory arrays 132 (i.e., the period between $t_5$ and $t_6$). In particular, timing circuit 136 causes the amount of time between driving the word line address $X_k$ to memory arrays 132 and activating the bit line sense amplifiers (i.e., the period between $t_4$ and $t_5$) to be a relatively short amount of time in response to the R1 signal, a medium amount of time in response to the R2 signal, and a relatively extended amount of time in response to the R3 or refresh signals using the sense amplifier start signal. Timing circuit 136 causes the amount of time between activating the bit line sense amplifiers and stopping the word line address $X_k$ from being driven to memory arrays 132 (i.e., the period between $t_5$ and $t_6$) to be a relatively extended amount of time in response to the R1 or refresh signals, a medium amount of time in response to the R2 signal, and a relatively short amount of time in response to the R3 signal using the word line end signal.

Control logic 128 generates the word line start signal and provides the word line start signal to memory arrays 132 to cause a word line selected by the refresh or external address to be activated. The word line start signal is provided to the input of a delay circuit 702. The output of delay circuit 702 is provided to the input of a delay circuit 704 and a first input (R1) of a multiplexer 708. The output of delay circuit 704 is provided to the input of a delay circuit 706 and a second input (R2) of multiplexer 708. The output of delay circuit 706 is provided to a third input (R3/REF) of multiplexer 708.

Multiplexer 708 provides the input from the first, the second, or the third input as the sense amplifier start signal in response to the R1, R2, or R3 signal from decoder 514 or a refresh signal (REF) from control logic 128. In particular, multiplexer 708 provides the input from the first input as the sense amplifier start signal in response to the R1 signal being active, multiplexer 708 provides the input from the second input as the sense amplifier start signal in response to the R2 signal being active, and multiplexer 708 provides the input from the third input as the sense amplifier start signal in response to the R3 signal or the refresh signal being active.

To generate the word line end signal, the sense amplifier start signal is provided to the input of a delay circuit 712. The output of delay circuit 712 is provided to the input of a delay circuit 714 and a first input (R3) of a multiplexer 718. The output of delay circuit 714 is provided to the input of a delay circuit 716 and a second input (R2) of multiplexer 718. The output of delay circuit 716 is provided to a third input (R1/REF) of multiplexer 718.

Multiplexer 718 provides the input from the first, the second, or the third input as the word line end signal in response to the R1, R2, or R3 signal from decoder 514 or a refresh signal (REF) from control logic 128. In particular, multiplexer 708 provides the input from the first input as the sense amplifier start signal in response to the R3 signal being active, multiplexer 708 provides the input from the second input as the sense amplifier start signal in response to the R2 signal being active, and multiplexer 708 provides the input from the third input as the sense amplifier start signal in response to the R1 signal or the refresh signal being active.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a memory array;
   an address buffer configured to receive an external address;
   a refresh address counter configured to generate a refresh address;
   a first circuit configured to detect a distance between the external address and refresh address; and
   a second circuit configured to generate at least one timing signal for accessing data associated with the external address from the memory array in response to the distance.

2. The memory of claim 1 wherein the memory array comprises a sense amplifier, and wherein the timing signal is configured to cause the sense amplifier to be activated.

3. The memory of claim 2 wherein the second circuit is configured to generate the timing signal at a first time in response to the distance comprising a first value, and wherein the second circuit is configured to generate the timing signal at a second time subsequent to the first time in response to the distance comprising a second value.

4. The memory of claim 3 wherein the memory array comprises a first region and a second region, wherein the first value is associated with the first region, and wherein the second value is associated with the second region.

5. The memory of claim 4 wherein the first region and the second region are defined relative to the external address.

6. The memory of claim 1 wherein the timing signal is configured to cause the external address to stop being provided to the memory array.

7. The memory of claim 6 wherein the second circuit is configured to generate the timing signal at a first time in response to the distance comprising a first value, and wherein the second circuit is configured to generate the timing signal at a second time subsequent to the first time in response to the distance comprising a second value.

8. The memory of claim 7 wherein the memory array comprises a first region and a second region, wherein the first value is associated with the first region, and wherein the second value is associated with the second region.

9. The memory of claim 8 wherein the first region and the second region are defined relative to the external address.

10. A method performed by a pseudo-static random access memory (PSRAM) that comprises a memory array, the method comprising:
receiving an external address from a host;
comparing the external address to a refresh address generated by the PSRAM; and
adjusting a first time period associated with accessing data associated with the external address from the memory array in accordance with comparing the external address to the refresh address.

11. The method of claim 10 further comprising:
performing a refresh operation to the memory array using the refresh address using a second time period in response to receiving the external address from the host.

12. The method of claim 11 further comprising:
performing an access to the memory array using the external address using the first time period in response to receiving the external address from the host.

13. The method of claim 12 wherein the first time period is less than the second time period.

14. The method of claim 12 further comprising:
adjusting the first time period by providing a signal configured to activate a sense amplifier in the memory array at a time determined by comparing the external address to a refresh address.

15. The method of claim 12 further comprising:
adjusting the first time period by providing a signal configured to stop the external address from being provided to the memory array at a time determined by comparing the external address to a refresh address.

16. The method of claim 12 further comprising:
comparing the external address to the refresh address by identifying which one of a plurality of regions includes the refresh address.

17. A system comprising:
a memory array comprising a first plurality of memory cells associated with a first address and a plurality of sense amplifiers associated with the plurality of memory cells;
an address buffer configured to receive the first address from a host;
a refresh address counter configured to generate a second address;
means for comparing the first address to the second address to determine when the plurality of memory cells associated with the external address was refreshed;
means for generating a first signal configured to cause the plurality of sense amplifiers to be activated at a first time determined by comparing the first address to the second address; and
means for generating a second signal configured to cause the first address to stop being driven to the memory array at a second time determined by comparing the first address to the second address.

18. The system of claim 17 wherein means for comparing the first address to the second address is configured to generate a third signal that indicates a relative distance between the first address and the second address.

19. The system of claim 17 further comprising:
a control circuit configured to cause a second plurality of memory cells associated with the second address to be refreshed in response to the first address being received by the address buffer.

20. The system of claim 19 wherein the control circuit is configured to cause the first plurality of memory cells to be accessed using the first address in response to the first address being received by the address buffer.

21. The system of claim 20 wherein the control circuit is configured to cause the second plurality of memory cells associated to be refreshed during the access to the first plurality of memory cells in response to the first address being equal to the second address.

22. The system of claim 20 wherein the control circuit configured to cause the second plurality of memory cells associated with the second address to be refreshed using a first time period, and wherein the control circuit is configured to cause the first plurality of memory cells to be accessed using the first address using a second time period that is less than the first time period.

* * * * *